(12) United States Patent
Lin et al.

(10) Patent No.: US 9,129,917 B2
(45) Date of Patent: Sep. 8, 2015

(54) ORGANIC LIGHT-EMITTING DEVICE AND CONTROL METHOD THEREOF

(75) Inventors: Chun-Liang Lin, Hsin-Chu (TW);
Chung-Chia Chen, Hsin-Chu (TW);
Hsin-Rong Tseng, Hsin-Chu (TW);
Chieh-Wei Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 701 days.

(21) Appl. No.: 13/456,325

(22) Filed: Apr. 26, 2012

(65) Prior Publication Data

US 2013/0127374 A1    May 23, 2013

(30) Foreign Application Priority Data

Nov. 18, 2011  (TW) ............................... 100142410 A

(51) Int. Cl.
*H01L 27/32* (2006.01)

(52) U.S. Cl.
CPC .................................. *H01L 27/3232* (2013.01)

(58) Field of Classification Search
CPC .............. G06F 1/30; G06F 1/00; H01L 27/00; H01L 27/3232
USPC ......................................................... 315/363
See application file for complete search history.

(56) References Cited

U.S. PATENT DOCUMENTS

| | | | |
|---|---|---|---|
| 5,757,127 A | 5/1998 | Inoguchi et al. | |
| 2011/0080376 A1* | 4/2011 | Kuo et al. | 345/177 |

FOREIGN PATENT DOCUMENTS

| | | |
|---|---|---|
| JP | 2006276089 | 10/2006 |
| TW | I243764 | 11/2005 |
| TW | M344111 | 11/2008 |

OTHER PUBLICATIONS

English translation of Miyaki JP 2006/276089.*
Chinese Patent Office, "Office Action", Oct. 25, 2013.

* cited by examiner

*Primary Examiner* — John Poos
*Assistant Examiner* — David Mattison
(74) *Attorney, Agent, or Firm* — WPAT, P.C.; Justin King

(57) ABSTRACT

An organic light-emitting device includes a first transparent substrate, an organic light-emitting diode and a bi-stable light control element. The organic light-emitting diode is disposed under the first transparent substrate. The bi-stable light control element is disposed under the organic light-emitting diode. The bi-stable light control element is configured to change an optical state thereof according to a received control signal and thereby changing the amount of lights capable of emitting through the bi-stable light control element. A control method for the aforementioned organic light-emitting device is also provided.

20 Claims, 3 Drawing Sheets

ORGANIC LIGHT-EMITTING DEVICE AND CONTROL METHOD THEREOF

TECHNICAL FIELD

The present disclosure relates to a light-emitting device and a control method thereof, and more particularly to an organic light-emitting device having a higher light extraction efficiency or a higher transmittance efficiency and a control method thereof.

BACKGROUND

In a recent year, organic light-emitting diodes, due to advantages such as self illumination, fast response speed and low power consumption, have been widely used in display and illumination applications. Generally, the organic light-emitting diode can be categorized to a top-emitting type, a bottom-emitting type and a two side-emitting type.

Please refer to FIG. 1, which is a schematic cross-sectional structure view of a bottom-emitting-type organic light-emitting diode in accordance with prior art. As shown, the bottom-emitting-type organic light-emitting diode 100 includes a metal layer 10, an organic light-emitting layer 12, a transparent conductive layer 14 and a transparent substrate 16.

When the organic light-emitting diode 100 is supplied with a specific voltage, electrons (not shown) and electron-holes (not shown) are combined to each other and emit lights with various emission angles (for example, lights 121, 123 and 125). Because the organic light-emitting layer 12 has an optical refraction smaller than that of the transparent conductive layer 14, the lights 121, 123 and 125 each can successfully emit into the transparent conductive layer 14 from the organic light-emitting layer 12.

Then, because the organic light-emitting layer 14 has an optical refraction greater than that of the transparent substrate 16, the light 121 with a relatively large emission angle in the transparent conductive layer 14 is totally reflected back to the transparent conductive layer 14 or even the organic light-emitting layer 12 from a surface between the transparent conductive layer 14 and the transparent substrate 16, and hardly emits to the air 18. Base on the same manner, because the organic light-emitting layer 14 has an optical refraction greater than that of the air 18, the light 123 with a relatively large emission angle in the transparent substrate 16 is totally reflected back to the transparent substrate 16 or even the transparent conductive layer 14 from a surface between the transparent substrate 16 and the air 18. Accordingly, only the light 125 with a relatively small emission angle can emit into the air 18 sequentially through the organic light-emitting layer 12, the transparent conductive layer 14 and the transparent substrate 16. Thus, the light coupling efficiency from the inner to the outer (or, the air 18) of the organic light-emitting diode 100 is only about 15% to 20%, if without any optical compensate design.

Today, in some optical compensate designs, an optical diffusion film is disposed at one side of the organic light-emitting diode 100 (specifically, the bottom surface of the transparent substrate 16) so as to enhance the light extraction efficiency of the organic light-emitting diode 100.

SUMMARY OF DISCLOSURE

Therefore, one object of the present disclosure is to provide an organic light-emitting device and a control method thereof. The organic light-emitting device includes a bi-stable light control element disposed at one side of an organic light-emitting diode therein. Through the bi-stable light control element, the light extraction efficiency and the transmittance of the organic light-emitting device can be modulated according to a specific requirement.

The present disclosure provides an organic light-emitting device, which includes a first transparent substrate, an organic light-emitting diode and a bi-stable light control element. The organic light-emitting diode is disposed under the first transparent substrate. The bi-stable light control element is disposed under the organic light-emitting diode. The bi-stable light control element is configured to change an optical state thereof according to a received control signal so as to change the amount of lights capable of emitting through the bi-stable light control element.

The present disclosure further provides a control method for the organic light-emitting device. The control method includes steps of: providing a control signal to the bi-stable light control element to change an optical state thereof and thereby changing the amount of lights capable of emitting through the bi-stable light control element; configuring the organic light-emitting diode to be operated in a non-illumination state when the bi-stable control element presents a first optical state; and configuring the organic light-emitting diode to be operated in an illumination state when the bi-stable control element presents a second optical state.

In summary, according to the organic light-emitting device and a control method thereof of the present disclosure, the bi-stable light control element is disposed at one side of the organic light-emitting diode. When the bi-stable light control element is configured to present the first optical state according to a specific requirement, the external lights can pass through the organic light-emitting device so as to increase the transmittance of the organic light-emitting device. Alternatively, when the bi-stable light control element is configured to present the second optical state according another requirement, the lights emitted from the two side-emitting-type organic light-emitting diode can be concentrated and extracting from one side of the organic light-emitting device so as to increase the light extraction efficiency of the organic light-emitting diode.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF EMBODIMENTS

Figure 1:
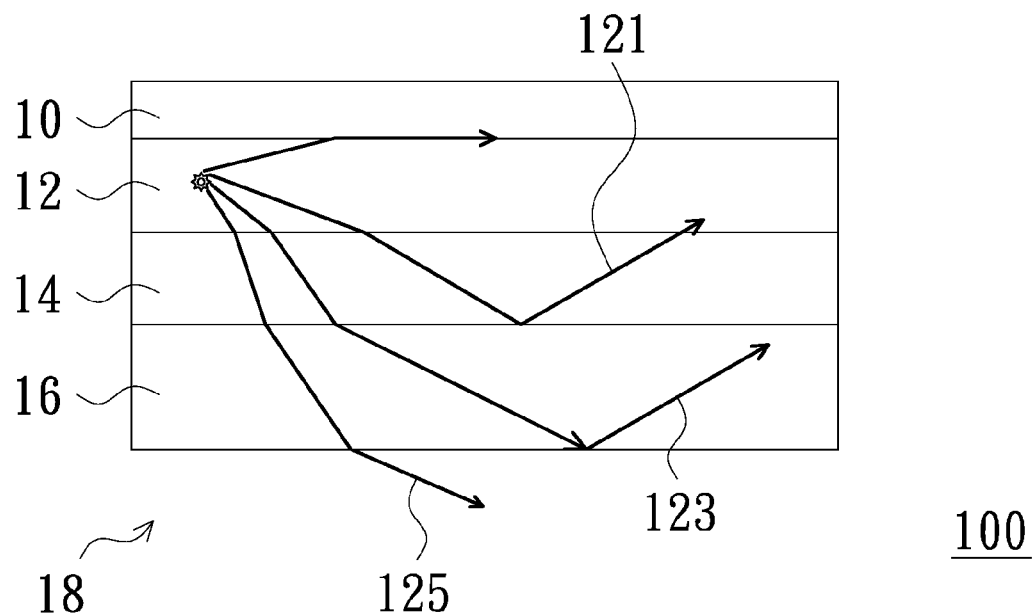
FIG. 1 is a schematic cross-sectional structure view of an organic light-emitting device in accordance with prior art.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Please refer to FIG. 2, which is a schematic cross-sectional structure view of an organic light-emitting device in accordance with a first embodiment of the present disclosure. As shown, the organic light-emitting device 200 includes a first transparent substrate 20, an organic light-emitting diode 218, a second transparent substrate 22, a bi-stable light control element 24 and a sealant 26.

The first transparent substrate 20 has a top surface (not designated) and a bottom surface (not designated). Preferably, the first transparent substrate 20 is made of glass materials or other substrate materials with a transmittance approximately greater than or equal to 80%. Preferably, in the present embodiment the transmittance of the first transparent substrate 20 is about 90%.

The organic light-emitting diode 218 is disposed under the bottom surface of the first transparent substrate 20. The organic light-emitting diode 218 includes a first electrode 210, an organic light-emitting layer 212 and a second electrode 214. The first electrode 210 can be formed in a deposition manner and disposed on the top surface of the second transparent substrate 22.

The organic light-emitting layer 212 is disposed on the top surface of the first electrode 210, and is constituted by an electron-hole transport layer (not shown), a light-emitting layer (not shown) and an electron transport layer (not shown).

The second electrode 214 can be formed in a sputter or a deposition manner and disposed on the top surface of the organic light-emitting layer 212. The second electrode 214 can have materials similar to or same as the first electrode 210 has. Preferably, the first electrode 210 and the second electrode 214 each are made of a transparent conducting oxide (TCO) or a thin metal. The TCO includes, with no limitation, an indium tin oxide (ITO), an indium zinc oxide (IZO), an aluminum-doped zinc oxide (AZO), a gallium zinc oxide (GZO) or indium molybdenum oxide (IMO), etc. The thin metal includes argentum (Ag), aluminum (Al) or an Ag—Al alloy, etc. The organic light-emitting layer 212 is configured to emit lights (or, configured in an illumination state) when the first electrode 210 and the second electrode 214 are supplied with proper voltages. The organic light-emitting diode 218 in FIG. 2 is exemplified by being configured not to emit lights (or, configured in a non-illumination state).

The second transparent substrate 22 has a top surface (not designated) and a bottom surface (not designated). Preferably, the second transparent substrate 22 is made of glass materials or other substrate materials with a transmittance approximately greater than or equal to 80%. In the present embodiment, the second transparent substrate 22 is disposed under the organic light-emitting diode 218 and preferably has a transmittance of 90%.

The sealant 26 is disposed between the first transparent substrate 20 and the second transparent substrate 22 and at one side of the organic light-emitting diode 218. Specifically, the sealant 26 is disposed at an edge of the organic light-emitting diode 218 so as to wrap a side surface of the organic light-emitting diode 218. The sealant 26 is, for example, constituted by inorganic particles having polymer materials or produced by glass powder sintering. The inorganic particles includes, with no limitation, $SiO_2$, $BaO$, $Bi_2O_3$, $Al_2O_3$, $TiO_2$, $TaO_5$ or $ZnO$.

Figure 2:
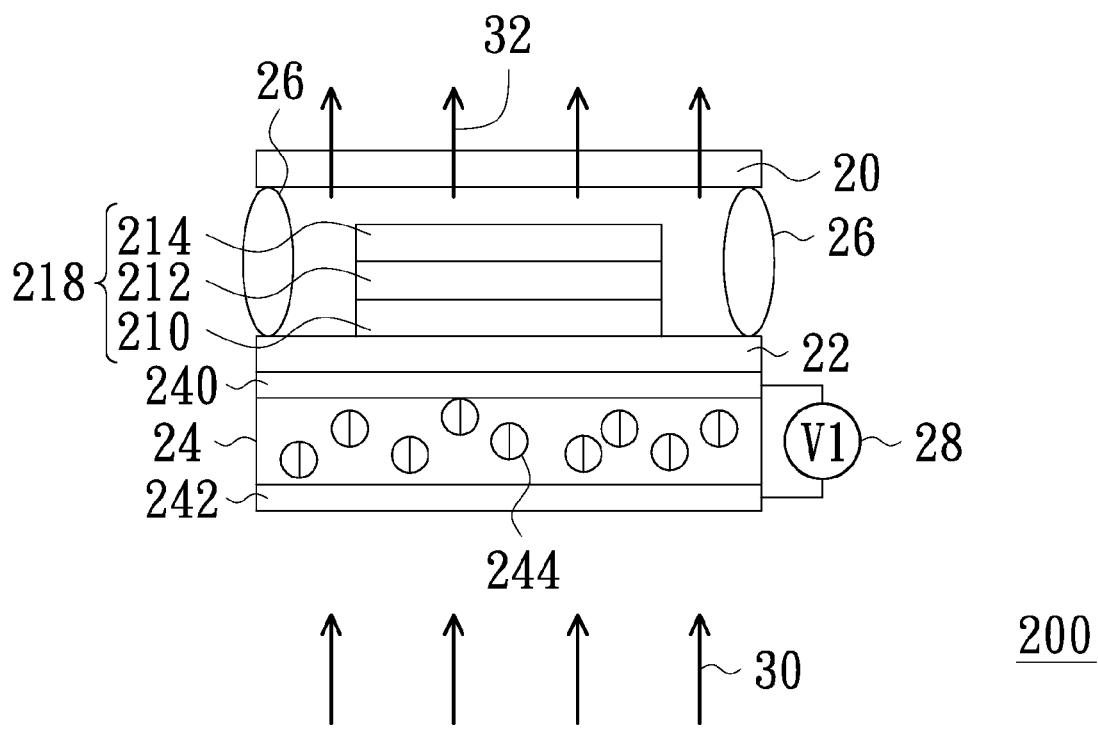
FIG. 2 is a schematic cross-sectional structure view of an organic light-emitting device in accordance with a first embodiment of the present disclosure.

As shown in FIG. 2, the bi-stable light control element 24 is disposed under the second transparent substrate 22. Preferably, a third electrode 240 is disposed on the bottom surface of the second transparent substrate 22 so as to prevent a gap from being formed therebetween and resulting in reflection or deflection lights. The bi-stable light control element 24 is configured to have a surface area equal to that of the second transparent substrate 22. The bi-stable material in the bi-stable light control element 24 is an electrochromic material, a cholesterol liquid crystal (CHLC) material or a polymer dispersed liquid crystal (PDLC) material. Preferably, the third electrode 240 is configured to have an optical refraction ratio smaller than or equal to that of the second transparent substrate 22, so as to prevent the light 30 from being totally reflected while being emitted from the third electrode 240 to the second transparent substrate 22. It is understood that, the second transparent substrate 22 can be omitted and accordingly the bi-stable light control element 24 is directly disposed on the bottom surface of the first electrode 210 in a specific organic light-emitting diode manufacture processing.

In another embodiment of the present disclosure, it is understood that the bi-stable light control element 24 can be disposed on the top surface of the first transparent substrate 20 if the organic light-emitting device 200 is configured to have one surface of the second transparent substrate 22 as its light-emitting surface. Moreover, the fourth electrode 242 is disposed on the top surface of the second transparent substrate 22; the fourth electrode 242 is configured to have an optical refraction ratio less than or equal to that of the first transparent substrate 20, preferably.

As shown in FIG. 2, the bi-stable light control element 24 includes the third electrode 240, the fourth electrode 242 and a plurality of liquid materials 244, which are distributed between the third electrode 240 and the fourth electrode 242. The third electrode 240 and the fourth electrode 242 are configured to be electrically coupled to a power source 28. According to a control signal (for example, a voltage or a voltage level) provided by the power source 28, the bi-stable light control element 24 is configured to control the arrangement of the liquid materials 244, so as further to control the optical state (e.g., a first optical state or a second optical state) it presents.

In the case of the liquid material 244 is PDLC, when the control signal is 5V or with a high voltage level, these liquid materials 244 are driven to be approximately parallel to the light 30 and accordingly the bi-stable light control element 24 is defined to have (or, present) the first optical state (or, a transparent state). Herein, the first optical state indicates that the bi-stable light control element 24 has a transmittance greater than or equal to 80%. Moreover, it is understood that the relationship between the control signal and the arrangement of the liquid materials 244 described above is used for an illustration only and without any limitation.

Therefore, the bi-stable light control element 24 is configured to present the first optical state (or, is configured to have a transmittance approximately greater than or equal to 80%) when being supplied with a specific control signal (for example, a first control voltage V1). Thus, the transmittance of the organic light-emitting device 200 is modulated correspondingly. Moreover, when the bi-stable light control element 24 presents the first optical state, the organic light-emitting diode 218 can be configured in a non-illumination state so as to reduce the power consumption.

Figure 3:
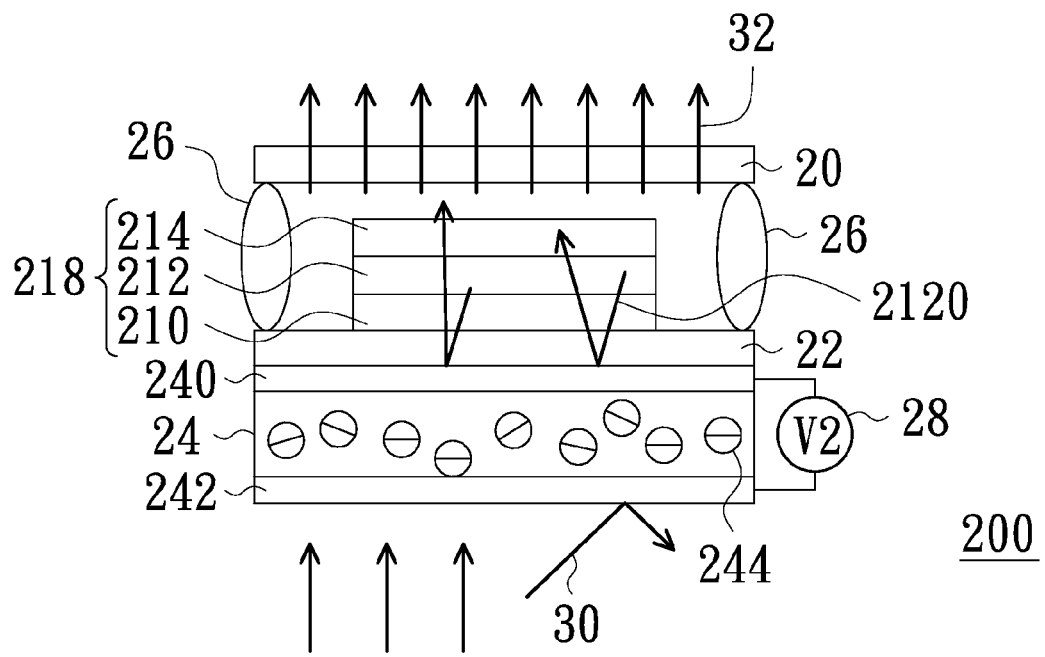
FIG. 3 is an alternative schematic cross-sectional structure view of the organic light-emitting device in accordance with the first embodiment of the present disclosure.

Please refer to FIG. 3, which is an alternative cross-sectional schematic structure view of the organic light-emitting device 200 in accordance with the first embodiment of the present disclosure. As shown, when the power source 28 is configured to supply a control signal of 0V (or, the bi-stable light control element 24 is not powered) or with a low voltage level, these liquid materials 244 are arranged irregularly and the light 30 emitting to the bi-stable light control element 24 will be reflected by the liquid materials 244. Accordingly the bi-stable light control element 24 is defined to have (or, present) the second optical state (or, a diffusion or an opaque state). Herein, the second optical state indicates that the bi-stable light control element 24 has an optical reflectance greater than or equal to 60%. Moreover, it is understood that the relationship between the control signal and the arrangement of the liquid materials 244 described above is used for an illustration only and without any limitation.

Therefore, the bi-stable light control element 24 is configured to present the second optical state when being supplied with a specific control signal (for example, a second control voltage V2). Thus, some of the lights emitted from the organic light-emitting layer 212 will be reflected from the bi-stable light control element 24 and toward the first transparent substrate 20. Accordingly, the light extraction (e.g., the amount of light 32) of the first transparent substrate 20 increases. Simultaneously, because the bi-stable light control element 24 can function as a diffusion film when presenting the second optical state, the lights trapped in the organic light-emitting diode 218 can be reflected from the bi-stable light control element 24 and toward the first transparent substrate 20, and the light extraction of the first transparent substrate 20 further increases. Moreover, when the bi-stable light control element 24 presents the second optical state, the organic light-emitting diode 218 can be configured to emit lights (in an illumination state) so as to increase an illumination of one side of the first transparent substrate 20.

Briefly, as illustrated in FIG. 3, when the bi-stable light control element 24 is not powered, the liquid materials 244 between the third electrode 240 and the fourth electrode 242 are irregularly arranged; thus, without emitting through the bi-stable light control element 24, the light 2120 from the organic light-emitting layer 212 is reflected from the bi-stable light control element 24 and emits to the first transparent substrate 20. Meanwhile, the bi-stable light control element 24 is, for example, white and opaque. Therefore, the increased lights emitting out from one surface of the first transparent substrate 20 not only includes the lights reflected from the second transparent substrate 22, but also includes the lights, originally trapped inside the organic light-emitting diode 218 and then successfully extracting cause the incident angle being less than a critical angle. Thus, the light extraction efficiency of the first transparent substrate 20 increases. Herein, the organic light-emitting layer 212 is configured to have an optical refraction about 1.7; the first electrode 210 and the second electrode 214 each are configured to an optical refraction about 2.0; and the first transparent substrate 20 and the second transparent substrate 22 each are configured to have an optical refraction about 1.5.

Alternatively, as illustrated in FIG. 2, when the bi-stable light control element 24 is powered, the liquid materials 244 between the third electrode 240 and the fourth electrode 242 are driven to be parallel to an electrical field and the light 30 can successfully emit through the bi-stable light control element 24. Meanwhile, the bi-stable light control element 24 is, for example, colorless and transparent.

Figure 4:
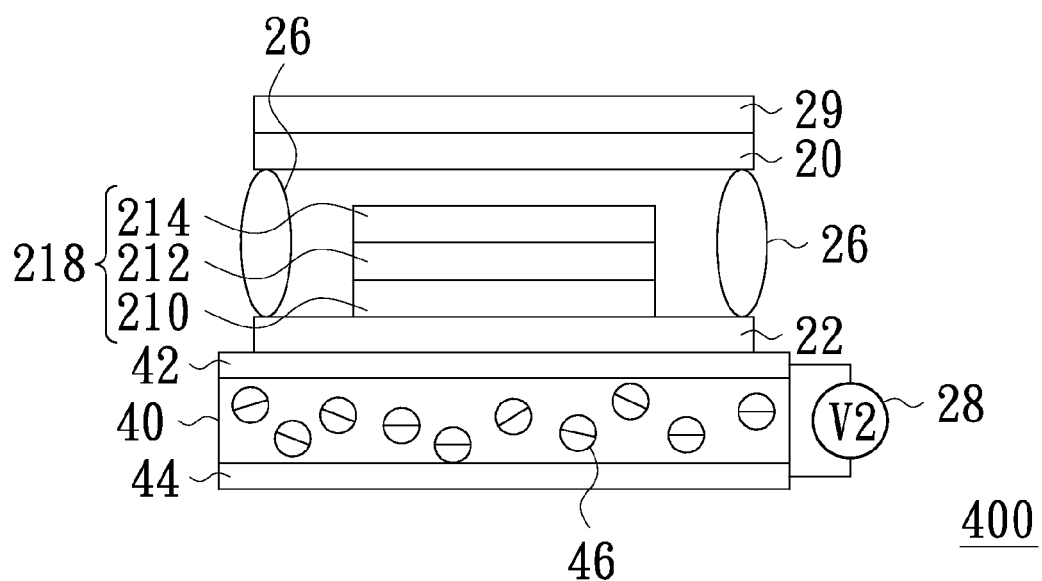
FIG. 4 is a schematic cross-sectional structure view of an organic light-emitting device in accordance with a second embodiment of the present disclosure.

Please refer to FIG. 4, which is a schematic cross-sectional structure view of an organic light-emitting device in accordance with of a second embodiment of the present disclosure. As shown, the organic light-emitting device 400 has a structure similar to that of the organic light-emitting device 200; and the main difference between the two is: in the second embodiment, the bi-stable light control element 40 is configured to have a surface area greater than that of the first transparent substrate 20; wherein the surface area of the bi-stable light control element 40 includes the surface areas of the third electrode 42 and the fourth electrode 44. In addition, the bi-stable light control element 40 is, with no limitation, configured to have liquid materials 46 more than the liquid materials 244 in the bi-stable light control element 24. A touch layer 29 is disposed on the first transparent substrate 20. The touch layer 29 is, for example, an impedance, a capacitance, a light-sensing, an electromagnetic, a supersonic or an in-cell liquid crystal display (LCD). The touch layer 29 is configured to sense a touch state corresponding to a user's operation.

Alternatively, the bi-stable light control element 40 can be configured to have a surface area smaller than that of the second transparent substrate 22. In addition, the bi-stable light control element 40 can be designed to have a portion thereof present the first optical state and another portion thereof present the second optical state in response to a specific design requirement.

Figure 5:
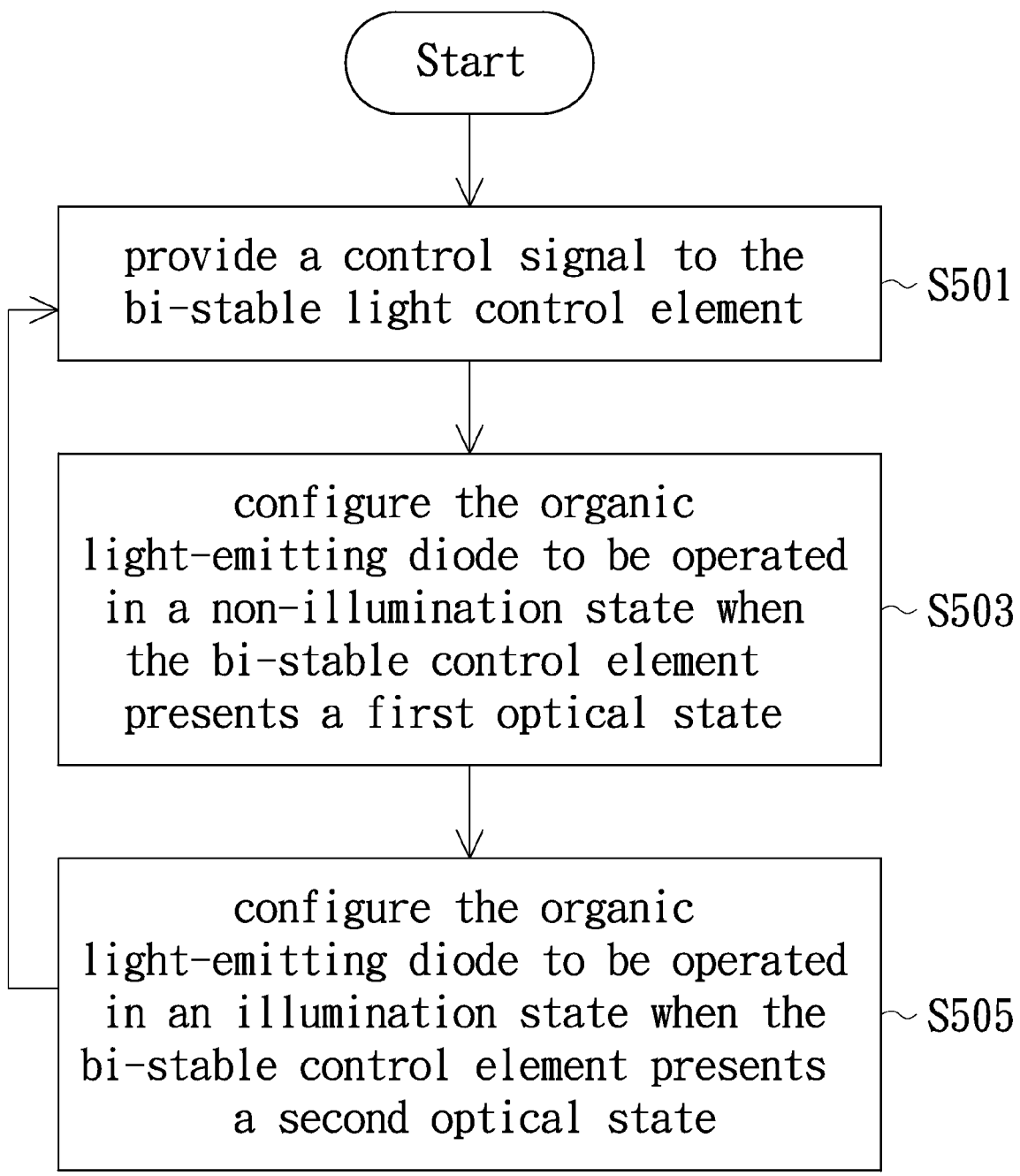
FIG. 5 is a schematic flow chart illustrating a control method for the organic light-emitting device in accordance with an embodiment of the present disclosure.

FIG. 5 is a schematic flow chart of a control method for the aforementioned organic light-emitting device in accordance with an embodiment of the present disclosure. Please refer to FIGS. 2, 3 and 5. Firstly, a control signal is provided to the bi-stable light control element 24 to change an optical state thereof and thereby changing the amount of lights capable of emitting through the bi-stable light control element 24 (S501).

Then, the organic light-emitting diode 218 is configured to be operated in a non-illumination state when the bi-stable control element 24 presents the first optical state (for example, a transparent structure) (S503). In another embodiment of the present disclosure, the organic light-emitting diode 218 is configured to be operated in a non-illumination state when the bi-stable control element 24 presents a opaque or a diffusion structure.

The organic light-emitting diode 218 is configured to be operated in a illumination state when the bi-stable control element 24 presents the second optical state (for example, a opaque or a diffusion structure) (S505).

To sum up, in the organic light-emitting device and the control method thereof according to the present disclosure, a bi-stable light control element is disposed on one side of an organic light-emitting diode. According to an actual requirement, the bi-stable light control element can be configured to present a first optical state thereby external lights can emit through the organic light-emitting device; and thus, the transmittance of the organic light-emitting device is modulated. Alternatively, the organic light-emitting device can be configured to present a second optical state thereby concentrating the lights, emitted from a two side-emitting-type organic light-emitting diode, to emit out from one side of the organic light-emitting device; and thus, the light extraction efficiency of the organic light-emitting diode.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An organic light-emitting device, comprising:
   a first transparent substrate;
   an organic light-emitting diode disposed under the first transparent substrate; and
   a bi-stable light control element disposed under the organic light-emitting diode and configured to change an optical state thereof according to a control signal so as to change the amount of incident lights outside the organic light-emitting device capable of passing through the bi-stable light control element.

2. The organic light-emitting device according to claim 1, further comprising a second transparent substrate disposed between the organic light-emitting diode and the bi-stable light control element.

3. The organic light-emitting device according to claim 1, wherein the optical state presents a first optical state or a second optical state according to a voltage level of the control signal.

4. The organic light-emitting device according to claim 3, wherein the first optical state indicates that the bi-stable light control element is configured to be transparent, the second optical state indicates that the bi-stable light control element is configured to be opaque.

5. The organic light-emitting device according to claim 3, wherein the bi-stable light control element presents the first optical state when the control signal is configured to be a first control voltage.

6. The organic light-emitting device according to claim 5, wherein the first-optical-state bi-stable light control element has a transmittance approximately greater than or equal to 80%.

7. The organic light-emitting device according to claim 3, wherein the bi-stable element presents the second optical state when the control signal is configured to be a second control voltage.

8. The organic light-emitting device according to claim 7, wherein the second-optical-state bi-stable light control element has a reflectance approximately greater than or equal to 60% and a haze approximately greater than or equal to 10%.

9. The organic light-emitting device according to claim 3, wherein the organic light-emitting diode is configured in a non-illumination state when the bi-stable control element presents the first optical state.

10. The organic light-emitting device according to claim 3, wherein the organic light-emitting diode is configured in an illumination state when the bi-stable control element presents the second optical state, and lights emitted from the organic light-emitting diode are reflected by the second-optical-state bi-stable light control element and emit in a direction toward the first transparent substrate.

11. The organic light-emitting device according to claim 1, wherein the bi-stable light control element is configured to have a surface area greater than or equal to that of the first transparent substrate.

12. The organic light-emitting device according to claim 2, wherein the bi-stable light control element is configured to have a surface area greater than or equal to that of the first transparent substrate.

13. The organic light-emitting device according to claim 2, wherein a sealant is disposed between the first and second transparent substrates and a side surface of the organic light-emitting diode.

14. The organic light-emitting device according to claim 2, wherein the organic light-emitting diode comprises:
a first transparent electrode disposed on the second transparent substrate;
an organic light-emitting layer disposed on the first transparent electrode; and
a second transparent electrode disposed on the organic light-emitting layer.

15. The organic light-emitting device according to claim 1, further comprising a touch layer disposed on the first transparent substrate.

16. An control method for an organic light-emitting device, the organic light-emitting device comprising a bi-stable light control element and a organic light-emitting diode, the control method comprises steps of:
providing a control signal to the bi-stable light control element to change an optical state and changing the amount of incident lights outside the organic light-emitting device capable of passing through the bi-stable light control element;
configuring the organic light-emitting diode to be operated in a non-illumination state when the bi-stable control element presents a first optical state that enables the incident lights outside the organic light-emitting device passing through the bi-stable light control element; and
configuring the organic light-emitting diode to be operated in an illumination state when the bi-stable control element presents a second optical state.

17. The control method for an organic light-emitting device according to claim 16, wherein the first optical state indicates that the bi-stable light control element is configured to be transparent, the second optical state indicates that the bi-stable light control element is configured to be opaque.

18. The control method for an organic light-emitting device according to claim 16, wherein the bi-stable light control element presents the first optical state when the control signal is configured to be a first control voltage, and the first-optical-state bi-stable light control element has a transmittance greater than or equal to 80%; wherein the bi-stable element presents the second optical state when the control signal is configured to be a second control voltage, and the second-optical-state bi-stable light control element has a reflectance approximately greater than or equal to 60% and a haze approximately greater than or equal to 10%.

19. An organic light-emitting device, comprising:
a first transparent substrate;
an organic light-emitting diode disposed under the first transparent substrate; and
a bi-stable light control element disposed under the organic light-emitting diode and configured to change an optical state thereof according to a control signal so as to change the amount of lights capable of emitting through the bi-stable light control element;
wherein the bi-stable light control element is configured to have a surface area greater than or equal to that of the first transparent substrate.

20. The organic light-emitting device according to claim 19, wherein the optical state presents a first optical state or a second optical state according to a voltage level of the control signal, the bi-stable light control element presents the first optical state when the control signal is configured to be a first control voltage.

* * * * *